(12) United States Patent
Hsu et al.

(10) Patent No.: US 6,242,815 B1
(45) Date of Patent: Jun. 5, 2001

(54) FLEXIBLE SUBSTRATE BASED BALL GRID ARRAY (BGA) PACKAGE

(75) Inventors: Kao-Yu Hsu; Shih-Chang Lee, both of Kaohsiung Hsien (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 0 days.

(21) Appl. No.: 09/455,918

(22) Filed: Dec. 7, 1999

(51) Int. Cl.$^7$ .................................................. H01L 23/48
(52) U.S. Cl. ........................ 257/786; 257/780; 257/783; 257/784
(58) Field of Search .................... 257/737, 738, 257/777, 778, 780, 782, 783, 786, 787, 781, 784, 773, 774; 438/108

(56) References Cited

U.S. PATENT DOCUMENTS

| | | | |
|---|---|---|---|
| 5,400,950 | * 3/1995 | Myers et al. | 228/180.22 |
| 5,677,575 | * 10/1997 | Maeta et al. | 257/778 |
| 5,731,636 | * 3/1998 | Chun | 257/784 |
| 5,773,882 | * 6/1998 | Iwasaki | 257/692 |
| 5,814,891 | * 9/1998 | Hirano | 257/778 |
| 5,841,194 | 11/1998 | Tsukamoto | 257/729 |
| 5,909,058 | * 6/1999 | Yano et al. | 257/712 |
| 6,060,775 | * 5/2000 | Ano | 257/693 |

FOREIGN PATENT DOCUMENTS

| | | | |
|---|---|---|---|
| 6-291153 | * 10/1994 | (JP) | . |
| 7-63818 | * 3/1995 | (JP) | . |

* cited by examiner

Primary Examiner—Olik Chaudhuri
Assistant Examiner—Alonzo Chambliss
(74) Attorney, Agent, or Firm—Stevens, Davis, Miller & Mosher, LLP

(57) ABSTRACT

A flexible substrate based BGA package mainly comprises a semiconductor chip securely attached onto a flexible film substrate through a nonconductive adhesive. The flexible film substrate is formed from a flexible film having a chip attaching area for carrying the semiconductor chip. The upper surface of the flexible film is provided with a plurality of chip connection pads, a plurality of solder pads, and at least a dummy pad which is disposed centrally on the chip attaching area. The purpose of the dummy pad is to increase the rigidity and strength of the central part of the chip attaching area. The chip connection pads are arranged about the periphery of the chip attaching area for electrically connected to the semiconductor chip. The solder pads are disposed about the dummy pad(s) and electrically connected to the corresponding chip connection pads. The flexible film has a plurality of through-holes formed corresponding to the solder pads such that each solder pad has a portion exposed within the corresponding through-hole for mounting a solder ball. A package body is formed over the semiconductor chip and the upper surface of the flexible film substrate.

13 Claims, 4 Drawing Sheets

FLEXIBLE SUBSTRATE BASED BALL GRID ARRAY (BGA) PACKAGE

BACKGROUND OF THE INVENTION

1. Field of the Invention

This invention generally relates to flexible substrate based ball grid array (BGA) packages, and more particularly to flexible film substrates for use in forming flexible substrate based BGA packages and manufacturing methods thereof.

2. Description of the Related Art

FIG. 1 depicts a conventional flexible substrate based BGA package 100 typically utilizing a flexible film substrate 110 (see FIG. 2) for carrying a semiconductor chip 120. The flexible film substrate 110 is provided with a plurality of chip connection pads 110a arranged about the periphery of the semiconductor chip 120. The semiconductor chip 120 is securely attached onto the flexible film substrate 110 through a nonconductive adhesive (e.g., epoxy resin) 122 and electrically connected to the chip connection pads 110a through a plurality of bonding wires 130. The chip connection pads 110a are electrically connected to a plurality of solder pads 110b through conductive traces 110d. The flexible film substrate 110 has a plurality of through-hole 110c disposed corresponding to solder pads 110b. Each solder pad 110b has a portion exposed within the corresponding through-hole 110c for mounting a solder ball 140. The upper surface of the flexible film substrate 110, the semiconductor chip 120 and the bonding wires 130 are encapsulated in a package body 150. The package body 150 is formed from insulating material such as epoxy. The flexible substrate based BGA package 100 is mounted to a substrate (not shown), such as a printed circuit board, through the solder balls 140.

Typically, the surfaces of the chip connection pads 110a and solder pads 110b are plated with a layer of metal (not shown) such as gold which bonds well with conventional bonding wire material. However, gold does not bond well with the nonconductive adhesive 122, so the central part of the chip attaching area is not provided with solder pads in order to enhance the adhesion between the flexible film substrate 110 and the nonconductive adhesive 122, whereby the semiconductor chip 120 is more securely attached onto the flexible film substrate 110. However, since the solder pads 110b are not evenly distributed on the chip attaching area 160 of the flexible film substrate 110, the central part thereof is prone to be deformed by the stress due to CTE (coefficient of thermal expansion) mismatch between the central part and other part of the chip attaching area 160. This may create problems of delamination between the chip and the substrate or die cracking.

SUMMARY OF THE INVENTION

It is a primary object of the present invention to provide a flexible substrate based BGA package comprising a flexible film substrate having a die attaching area for carrying a semiconductor chip, wherein the flexible film substrate is provided with at least a dummy pad disposed centrally on the chip attaching area, thereby reducing problems of delamination between the chip and the substrate or die cracking.

It is another object of the present invention to provide a flexible substrate based BGA package comprising a semiconductor chip securely attached onto a die attaching area of a flexible film substrate through a nonconductive adhesive, wherein the flexible film substrate is provided with at least a dummy pad disposed centrally on the chip attaching area, and the dummy pad has a cupric oxide coating formed thereon for enhancing its adhesion with the nonconductive adhesive.

A flexible substrate based BGA package in accordance with a preferred embodiment of the present invention generally comprises a semiconductor chip securely attached onto a flexible film substrate through a nonconductive adhesive. The flexible film substrate includes a flexible film having a chip attaching area for carrying the semiconductor chip. The upper surface of the flexible film is provided with a plurality of chip connection pads, a plurality of solder pads, and at least a dummy pad which is disposed centrally on the chip attaching area. Preferably, the surface of the dummy pad has a cupric oxide coating for enhancing its adhesion with the nonconductive adhesive. The chip connection pads are arranged about the periphery of the chip attaching area. The solder pads are disposed about the dummy pad(s) and electrically connected to the corresponding chip connection pads. The flexible film has a plurality of through-holes formed corresponding to the solder pads such that each solder pad has a portion exposed within the corresponding through-hole for mounting a solder ball. A package body is formed over the semiconductor chip and the upper surface of the flexible film substrate.

According to the flexible substrate based BGA package of the present invention, since at least a dummy pad is disposed centrally on the chip attaching area of the flexible film substrate, the central part of the chip attaching area of the substrate has a better rigidity and strength to resist external forces thereby reducing the problems of die cracking or delamination. Further, the cupric oxide coating on the surface of the dummy pad has a contour of roughness, so the bonding mechanism of the interface between the cupric oxide coating and the nonconductive adhesive includes chemical bonding as well as mechanical interlock thereby greatly enhancing the adhesion between the dummy pad and the nonconductive adhesive thereby reducing the occurrence of delamination.

The present invention further provides a method for producing a flexible film substrate comprising the steps of: (A) providing a flexible film having opposing upper and lower surfaces, the upper surface of the flexible film has a chip attaching area adapted for carrying a semiconductor chip; (B) forming a plurality of through-holes in the flexible film; (C) laminating a metal layer on the upper surface of the flexible film; and (D) etching the metal layer to form a plurality of solder pads, chip connection pads, conductive traces, and at least a dummy pad, wherein the solder pads are disposed corresponding to the through-holes and electrically connected to the chip connection pads through the conductive traces, and the dummy pad is disposed centrally on the chip attaching area.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
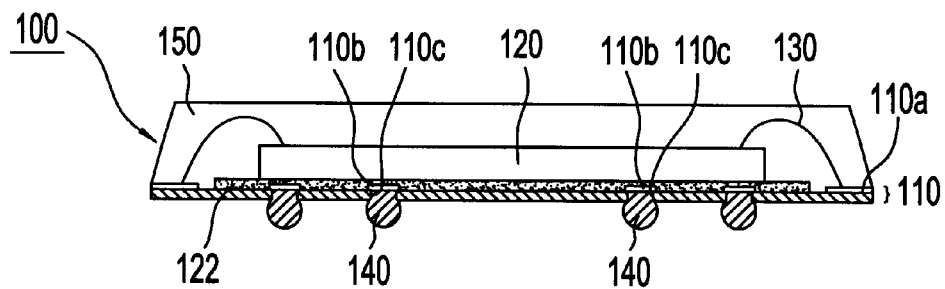
FIG. 1 is a cross sectional view of a conventional flexible substrate based BGA package.
Figure 2:
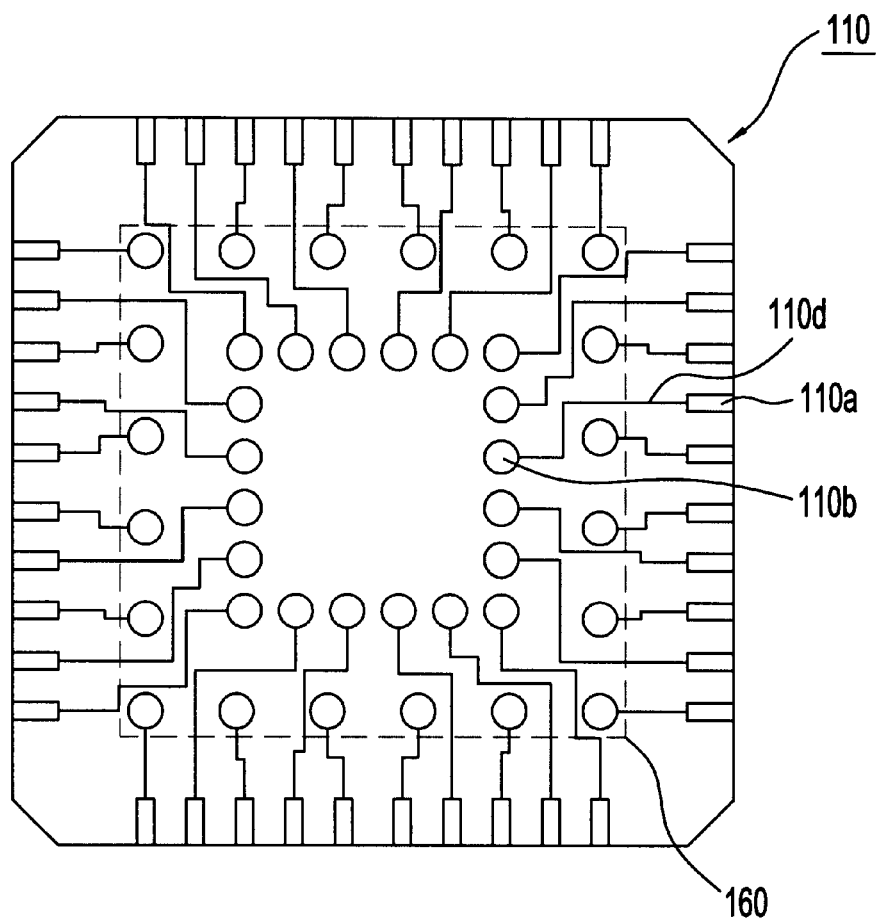
FIG. 2 is a top plan view of a flexible film substrate employed in the flexible substrate based BGA package of FIG. 1.
Figure 3:
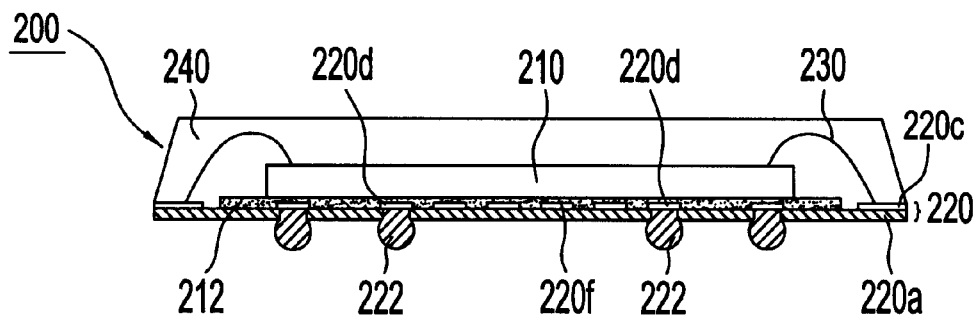
FIG. 3 is a cross sectional view of a flexible substrate based BGA package according to a preferred embodiment of the present invention.

FIG. 3 illustrates a flexible substrate based BGA package 200 according to a preferred embodiment of the present invention mainly comprising a semiconductor chip 210 securely attached onto the upper surface of a flexible film substrate 220 by a nonconductive adhesive (e.g. epoxy resin) 212.

Figure 7:
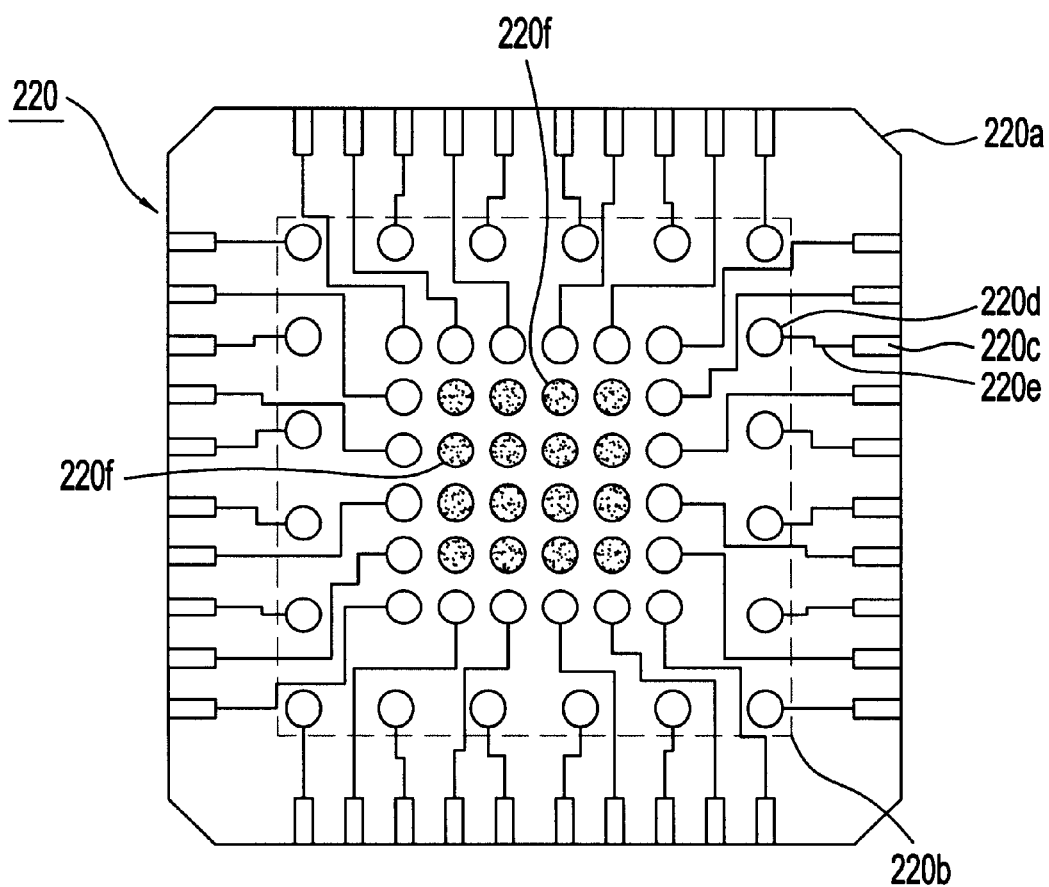
FIG. 7 is a top plan view of a flexible film substrate according to a first embodiment of the present invention.

Referring to FIG. 3 and FIG. 7, the flexible film substrate 220 is mainly formed from a flexible film 220a having a chip attaching area 220b adapted for carrying the semiconductor chip 210. The upper surface of flexible film 220a is provided with a plurality of chip connection pads 220c electrically connected to the corresponding solder pads 220d through conductive traces 220e formed on the upper surface of the flexible film 220a. The chip connection pads 220c are arranged about the periphery of the chip attaching area 220b and electrically connected to the semiconductor chip 210 through a plurality of bonding wires 230. The flexible film 220a has a plurality of through-holes formed corresponding to the solder pads 220d such that each solder pad 220d has at least a portion exposed within the corresponding through-hole for mounting a solder ball 222. A package body 240 is formed over the semiconductor chip 210 and the upper surface of the flexible film substrate 220. The solder balls 222 are provided on the lower surface of the flexible film substrate 220 for making external electrical connection.

Figure 8:
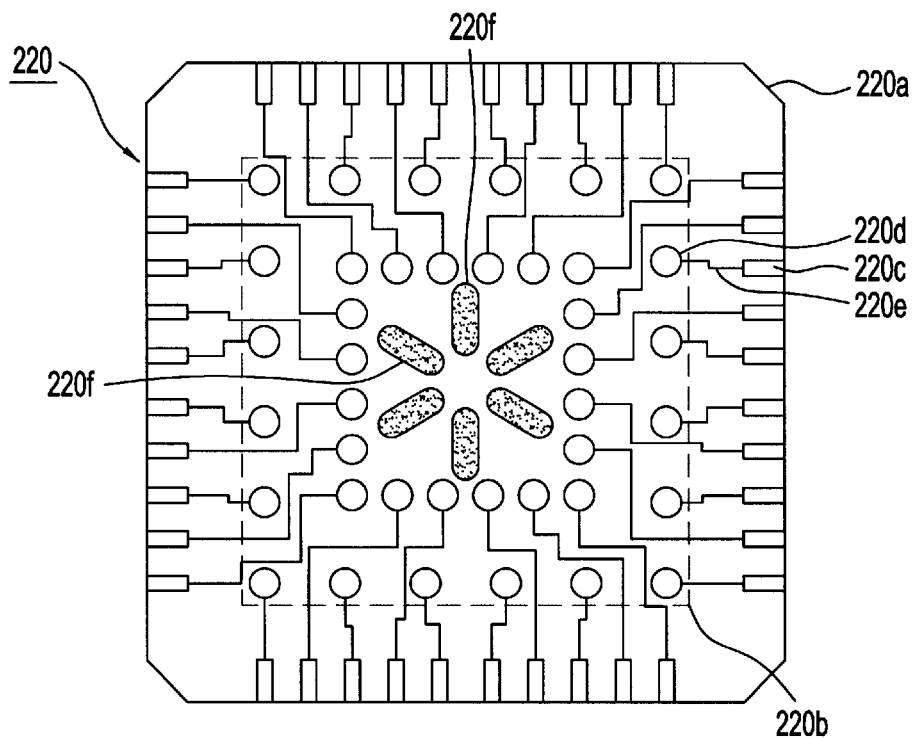
FIG. 8 is a top plan view of a flexible film substrate according to a second embodiment of the present invention.
Figure 9:
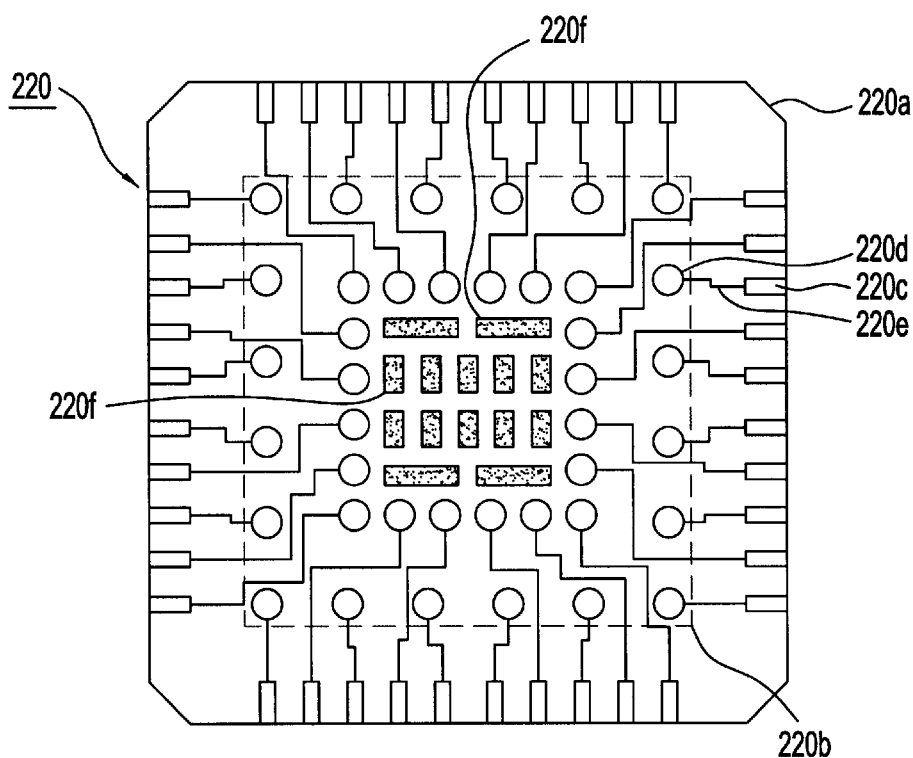
FIG. 9 is a top plan view of a flexible film substrate according to a third embodiment of the present invention.

Referring to FIG. 3 and FIG. 7 again, the present invention is characterized in that the flexible film substrate 220 is provided with at least a dummy pad disposed centrally on the chip attaching area 220b. Preferably, the dummy pads 220f are formed as a discontinuous pattern and evenly distributed on the central part of the chip attaching area (see FIGS. 6–9), whereby optimum reinforcing effect can be achieved without interfering the flow of the nonconductive adhesive 212. The dummy pad 220f in accordance with the present invention may be bar-like, oval-shaped or circular as shown in FIGS. 7–9. It will be appreciated that the number and shapes of the dummy pads are not limited to the embodiments of FIGS. 6–9 as long as the flow of the nonconductive adhesive 212 is not interfered and the central part of the chip attaching area of the substrate is reinforced.

Figure 4:
FIGS. 4–6 are cross sectional views for illustrating a method for producing a flexible film substrate in accordance with the present invention.
Figure 5:
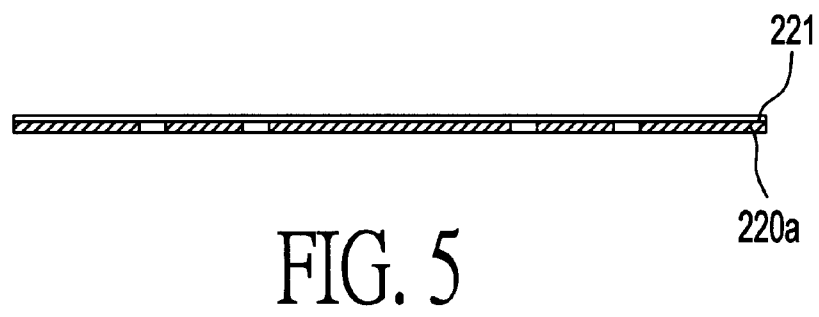
Figure 6:
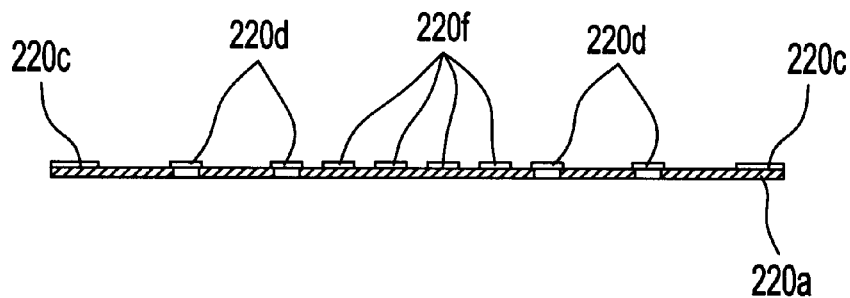

FIGS. 4–6 show a method for producing a flexible film substrate in accordance with the present invention.

Referring to FIG. 4, a plurality of through-holes are formed in the flexible film 220a by conventional techniques such as punching or laser drilling. The through-holes are formed at locations corresponding to the solder pads 220d disposed at the bottom section of the package 200 (see FIG. 3). Preferably, the flexible film 220a is made of polyimide such that the flexible film is given properties that allow it to pass reliability tests.

Referring to FIG. 5, a metal layer such as a copper foil 221 is laminated on the flexible film 220a by conventional methods such as thermocompression.

Referring to FIG. 6, the chip connection pads 220c, the solder pads 220d, conductive traces 220e (not shown in FIG. 6), and the dummy pads 220f are formed by photolithography and etching which comprise the steps of: (A) applying a photoresist layer on the surface of the metal layer; (B) pattern (referring to FIG. 7) transferring by photolithography; (C) removing the unprotected portions of the metal layer to form the corresponding chip connection pads 220c, solder pads 220d, conductive traces 220e, and dummy pads 220f by etching; and (D) removing the remaining photoresist layer. Preferably, the chip connection pads 220c, the solder pads 220d, and conductive traces 220e are provided with a metal coating formed on the surfaces thereof which are not covered by the flexible film 220a. The metal coating may be plated by conventional techniques. Preferably, a layer of nickel is plated thereon and then a layer of gold is plated on the nickel layer. Since the metal coating is also formed on the connection pads adapted for electrical connecting to the chip, the metal coating should be formed of materials that allow a good bond to the conventional bonding wire material.

Preferably, the dummy pads 220f are provided with a cupric oxide coating formed on the surface thereof. The cupric oxide coating 220a is preferably formed by the method of anodic oxidation: (A) Areas on the flexible film substrate at which it is undesired to form a cupric oxide coating are protected by tapes, e.g., the chip connection pads 220c, the solder pads 220d, and conductive traces 220e; (B) The flexible film substrate with protective tapes is electrolyzed as the anode in an alkaline solution such as sodium hydroxide electrolytic solution, thereby forming a cupric oxide coating on the surface of the flexible film substrate without protection of tapes. The principal crystal structure of the cupric oxide coating layer is composed of acicular crystals which are black in color and densely packed; hence, the cupric oxide coating has a rough appearance with a color of black. Alternatively, the cupric oxide coating on the dummy pads according to the present invention can be formed by the method of chemical oxidation: the step (A) is identical to the method described above; (B') The flexible film substrate with protective tapes is immersed in a chemical oxidation solution (such as water solution of 3% sodium chloride, 1% sodium hydroxide and 1% sodium phosphate by weight) and heated at 85° C.

According to one aspect of the present invention, since at least a dummy pad is disposed centrally on the chip attaching area of the flexible film substrate, the central part of the chip attaching area of the substrate has a better rigidity and strength to resist external forces. Further, since the dummy pads of the present invention are evenly distributed on the central part of the chip attaching area, the central part of the chip attaching area has a CTE substantially equal to other part thereof thereby reducing the stress due to CTE mismatch therebetween. Thus, the flexible film substrate in accordance with the present invention greatly reduces the problems of die cracking or delamination.

According to another aspect of the present invention, since the cupric oxide coating on the surface of the dummy pads is composed of acicular crystals which are black in color and densely packed, the gaps among the acicular crystals will be filled by the nonconductive adhesive (e.g., epoxy resin) employed in the die attaching process. After curing, the nonconductive adhesive will provide mechanical interlock mechanism to enhance the adhesion between the cupric oxide coating and the nonconductive adhesive, thereby reducing the occurrence of delamination between the flexible film substrate and the nonconductive adhesive.

Although the invention has been explained in relation to its preferred embodiment, it is to be understood that many other possible modifications and variations can be made without departing from the spirit and scope of the invention as hereinafter claimed.

What is claimed is:

1. A flexible substrate based ball grid array (BGA) package comprising:

a flexible film substrate comprising a flexible film having opposing upper and lower surfaces, the upper surface of the flexible film having a chip attaching area;

at least a dummy pad disposed centrally on the chip attaching area;

a plurality of chip connection pads arranged about the periphery of the chip attaching area;

a plurality of solder pads on the upper surface of the flexible film electrically connected to the corresponding chip connection pads, wherein the flexible film has a plurality of through-holes formed corresponding to the solder pads and the dummy pad is not electrically connected to the chip connection pads;

a plurality of solder balls mounted to the solder pads of the flexible film substrate for making external electrical connection;

a semiconductor chip securely attached onto the chip attaching area of the flexible film substrate, the chip having a plurality of bonding pads electrically connected to the corresponding chip connection pads; and a package body formed over the semiconductor chip and the upper surface of the flexible film substrate.

2. The flexible substrate based BGA package as claimed in claim 1, wherein the flexible film is made of polyimide.

3. The flexible substrate based BGA package as claimed in claim 1, wherein the dummy pad is made of copper.

4. The flexible substrate based BGA package as claimed in claim 3, further comprising a cupric oxide coating formed on the dummy pad.

5. The flexible substrate based BGA package of claim 4, wherein the cupric oxide coating is formed by anodic oxidation.

6. The flexible substrate based BGA package of claim 4, wherein the cupric oxide coating is formed by chemical oxidation.

7. A flexible film substrate for use in forming a flexible substrate based BGA package, the flexible film substrate comprising:

a flexible film having opposing upper and lower surfaces, the upper surface of the flexible film having a chip attaching area for supporting a semiconductor chip;

at least a dummy pad disposed centrally on the chip attaching area;

a plurality of chip connection pads arranged about the periphery of the chip attaching area for electrically connecting to the semiconductor chip, wherein the dummy pad is not electrically connected to the chip connection pads; and a plurality of solder pads on the upper surface of the flexible film electrically connected to the corresponding chip connection pads, wherein the flexible film has a plurality of through-holes formed corresponding to the solder pads.

8. The flexible film substrate as claimed in claim 7, wherein the flexible film is made of polyimide.

9. The flexible film substrate as claimed in claim 7, wherein the dummy pad is made of copper.

10. The flexible film substrate as claimed in claim 9, further comprising a cupric oxide coating formed on the dummy pad.

11. The flexible film substrate as claimed in claim 7, wherein the substrate is one of a plurality of substrates formed in a strip configuration for use in forming a plurality of substrate-based semiconductor chip package.

12. The flexible film substrate of claim 6, wherein the cupric oxide coating is formed by anodic oxidation.

13. The flexible film substrate of claim 6, wherein the cupric oxide coating is formed by chemical oxidation.

* * * * *